(12) United States Patent
Smit et al.

(10) Patent No.: US 11,271,029 B2
(45) Date of Patent: Mar. 8, 2022

(54) IMAGE SENSOR AND IMAGING SYSTEM COMPRISING THE SAME

(71) Applicant: Teledyne DALSA B.V., Eindhoven (NL)

(72) Inventors: Chiel Smit, Waalre (NL); Willem J. Kindt, Berkel en Rodenrijs (NL)

(73) Assignee: Tetedyne DALSA B.V., Eindhoven (NL)

( * ) Notice: Subject to any disclaimer, the term of this patent is extended or adjusted under 35 U.S.C. 154(b) by 0 days.

(21) Appl. No.: 17/164,911

(22) Filed: Feb. 2, 2021

(65) Prior Publication Data
US 2021/0320143 A1    Oct. 14, 2021

(30) Foreign Application Priority Data
Apr. 9, 2020  (EP) ..................................... 20169085

(51) Int. Cl.
*H01L 27/146* (2006.01)
*H04N 5/3745* (2011.01)
*H04N 5/378* (2011.01)
*H04N 5/32* (2006.01)

(52) U.S. Cl.
CPC ......... *H01L 27/14658* (2013.01); *H04N 5/32* (2013.01); *H04N 5/378* (2013.01); *H04N 5/37455* (2013.01)

(58) Field of Classification Search
None
See application file for complete search history.

(56) References Cited

U.S. PATENT DOCUMENTS

| 6,380,766 B2* | 4/2002 | Savord ................. B06B 1/0207 327/108 |
| 2014/0054447 A1* | 2/2014 | Kato ................. H01L 27/14612 250/208.1 |

FOREIGN PATENT DOCUMENTS

WO    2005055591 A1    6/2005

* cited by examiner

*Primary Examiner* — Edwin C Gunberg
(74) *Attorney, Agent, or Firm* — K&L Gates LLP

(57) ABSTRACT

The present invention relates to an image sensor and to an imaging system comprising the same. The present invention particularly relates to X-ray image sensors and imaging systems. The image sensor according to the invention comprises a pixel array that includes a plurality of active pixels arranged in a matrix of rows and columns, and a plurality of column lines to which outputs of pixels in the same column are coupled for the purpose of outputting pixel signals. The image sensor further comprises readout circuitry that includes a plurality of readout units, each readout unit being configured for reading out a respective column line through an input node of the readout unit. The image sensor is characterized in that the image sensor further comprises capacitive units, such as capacitors, for capacitively coupling each input node to its corresponding column line.

21 Claims, 11 Drawing Sheets

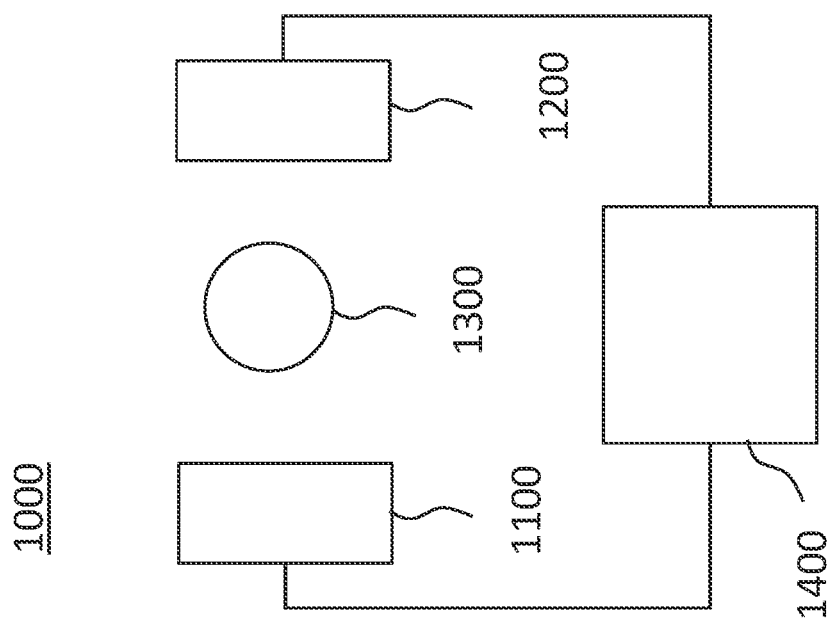

IMAGE SENSOR AND IMAGING SYSTEM COMPRISING THE SAME

The present invention relates to an image sensor and to an imaging system comprising the same. The present invention particularly relates to X-ray image sensors and imaging systems.

Unless stated otherwise, an image sensor according to the present invention comprises an image sensor that is configured for capturing electromagnetic radiation. This radiation can in particular be in the form of visible light or it can be in the form of X-rays.

When the image sensor is configured for sensing X-rays, it may comprise a photosensitive element, such as a photodiode, that is configured for absorbing incoming X-ray photons and to generate a photocurrent. This type of conversion is referred to as direct conversion. Other image sensors may comprise a scintillator layer that converts incoming X-ray photons into visible light photons. These latter photons can be absorbed by the photosensitive element that in turn generates a photocurrent. This type of conversion is referred to as indirect conversion. The present invention relates to both types of conversion.

An image sensor typically comprises a pixel array. This array comprises a plurality of pixels arranged in a matrix of rows and columns. The image sensor generally further comprises a plurality of column lines to which outputs of pixels in the same column are coupled for the purpose of outputting pixel signals. The image sensor is further provided with readout circuitry that comprises a plurality of readout units, each readout unit being configured for reading out a respective column line through an input node of the readout unit.

An example of a known image sensor 1 is shown in FIG. 1. Here, only a single pixel 2 of the matrix is shown for illustrative purposes. Pixel 2 is a passive pixel comprising a photodiode PD that is coupled in between ground and the source terminal of a select FET Ts of which the gate is connected to a row select line rs. Instead of having the anode fixed at ground potential a different potential such as −5V could be used. The drain terminal of select FET Ts is connected to a column line cl. Some parasitic capacitance is associated with this line. In FIG. 1, this parasitic capacitance is represented by capacitor Cp. Typically, each row of the pixel matrix is connected to a respective row select line and each column is connected to a respective column line. For the purpose of driving the row select lines, image sensor 1 comprises a row controller (not shown) that ensures that two pixels in the same column are not inadvertently connected to the same column line at the same time.

Image sensor 1 further comprises readout circuitry. This circuitry comprises a plurality of readout units 3, typically one unit per column line. In FIG. 1, a single readout unit 3 is shown that comprises a charge amplifier 31, a correlated double sampling 'CDS' unit 32, and an analog-to-digital converter 'ADC' 33.

Charge amplifier 31 comprises a differential amplifier 34, such as an operational amplifier, having a non-inverting terminal '+' connected to a reference voltage Vref, and an inverting terminal '−' connected to the output of amplifier 34 via a feedback capacitor Cf. A switch sl is arranged parallel to feedback capacitor Cf.

The output of amplifier 34 is connected to CDS unit 32 which performs two measurements and feeds the difference between these measurements to ADC 33 for converting the difference into a digital number.

In FIG. 1, the pixel array is arranged on a thin-film transistor 'TFT' panel. More in particular, the thin-film transistors on the TFT panel correspond to select transistors Ts. Photodiode PD is generally realized by arranging small islands of photosensitive material, such as amorphous silicon, on the TFT panel.

Furthermore, in FIG. 1, readout unit 3 is realized in an integrated circuit arranged on a semiconductor die. Typically, readout unit 3 is realized in complementary metal-oxide-semiconductor 'CMOS' technology. The division between integration on a semiconductor die and integration on the TFT panel is indicated by dotted line 4.

During pixel readout, pixel 2 is connected through select FET Ts to column line cl. Column line cl, including its parasitic capacitance Cp, is initially reset to Vref by switch sl of charge amplifier 31 being in a closed state. At this stage, the output of charge amplifier 31 is sampled by CDS unit 32 as a first pixel readout. When pixel 2 is selected via select FET Ts, the internal capacitance of photodiode PD, hereinafter referred to as Cdiode, is also charged to Vref. If the internal capacitance had previously been discharged by a photocurrent, then the potential across the internal capacitance would start at Vref−Vsig. This implies that there is a negative signal charge Qsig=Cdiode×Vsig on Cdiode. To reset photodiode PD to Vref, this signal charge has to move across the column line to feedback capacitance Cf of charge amplifier 31. It is noted that at this stage, switch sl is open. Consequently, the voltage at the output of charge amplifier 31 rises with an amount dV=Qsig/Cf. This voltage step at the output of charge amplifier 31, i.e. from Vref to Vref+Qsig/Cf, is sampled by CDS unit 32 as a second pixel readout. The difference between the sampled first and second pixel readouts is subsequently converted to a digital number by ADC 33. In this manner, CDS unit 32 cancels the reset noise and charge injection that occurs in charge amplifier 31.

Column line cl has a large parasitic capacitance Cp. This creates a noise problem. Charge amplifier 31 is keeping the potential on Cp constant at Vref, which corresponds to the voltage at its non-inverting terminal '+'. However, in reality, charge amplifier 31 keeps the voltage on Cp equal to Vref plus its own noise voltage. The latter can be represented by a voltage source in series with non-inverting terminal '+' of amplifier 34. More in particular, amplifier 34 forces a current through feedback capacitor Cf into Cp, in order to charge Cp to the noise of amplifier 34. This current charges not only Cp, but also Cf. There is a noise gain of approximately Cp/Cf. Since typically Cf<<Cp, for example Cp=30 pF and Cf=300 fF, the noise gain can be very high. Because of this high noise gain, the noise of amplifier 34 should be as low as possible.

Low noise can be achieved by biasing the input stage of amplifier 34 using a high current. This considerably increases the power dissipation thereby causing self-heating in the image sensor. This may become a problem as at high temperatures, scintillator layers, as used in indirect conversion X-ray image sensors, may degrade and a leakage current of photodiode PD may increase, resulting in more dark noise.

Another manner to get low noise is to reduce the bandwidth of CDS unit 32 for sampling the signals. Typically, a low-pass filter is inserted between charge amplifier 31 and CDS unit 32. The lower the bandwidth of this low-pass filter, the lower the noise. Clearly, there is a tradeoff between power dissipation (self heating), speed (bandwidth) and noise. This trade-off is a fundamental limitation of passive pixel TFT panels.

The noise/speed/power tradeoff discussed before can be avoided with an active pixel. FIG. 2, in which the same reference signs are used to refer to the same or similar components as in FIG. 1, illustrates a known image sensor 1 in which active pixels 2 are used.

Active pixel 2 is a known three transistor (3T) pixel comprising a reset FET Tr, a select FET Ts, and a source follower SF. It is referred to as an active pixel because source follower SF provides a buffering function within pixel 2.

In active pixel 2, photodiode PD will charge the storage capacitor that is either a capacitance internal to photodiode PD or an external capacitor. This charging is reflected in the voltage at node N. This latter node can be reset to a reference voltage, Vres, using reset FET Tr that is controlled by a row controller (not shown) using reset line rt. When detecting light, the resulting photocurrent will gradually discharge the storage capacitor resulting in a decrease in the voltage at node N.

The voltage at node N can be read out using select transistor Ts that is controlled by a row controller (not shown) using row select line rs. When activated, the voltage at node N will be put onto column line cl via source follower SF. This latter transistor is biased using current source 35 that is internal to readout unit 3. As shown in FIG. 2, column line cl is driven between Vdd and ground. The latter being related to current source 35 having one terminal connected to column line cl and the other terminal to ground.

Active pixels 2 are generally realized using CMOS technology. However, compared to TFT panels, a size of CMOS based pixel arrays is more difficult and costly to increase. Efforts have therefore been undertaken to realize active pixel arrays on TFT panels. The Applicant has however found that realizing active pixel arrays on TFT panels is not without problems. More in particular, transistors made in a glass TFT panel fabrication process have a large threshold variation. The threshold voltages of the TFTs vary because of process variation, temperature variation, negative or positive bias temperature instability, and exposure to X-rays. All of these effects are much larger in TFT technology than in CMOS technology.

Using a standard integrated circuit fabrication process for realizing the readout circuitry will impose a limit for the supply voltages to be used, e.g. 3.3V or 5V. The voltage on input node M of readout unit 3 should be within the supply rails. Variation in the threshold voltage of the TFTs reduces the available room for signal swing. More in particular, the voltage on column line cl and node M is equal to the voltage on photodiode PD and node N minus the threshold voltage of source follower SF. Any TFT threshold variations will therefore introduce voltage variations on node M. In addition, some headroom is required for current source 35 that biases source follower SF.

If the threshold variation is 3V and if a 3.3V supply should be used for readout unit 3, an essentially zero dynamic range would remain for the signal. The lack of dynamic range therefore complicates the combination of known standard CMOS readout circuitry and TFT panels.

It is an object of the present invention to provide an image sensor comprising a plurality of active pixels in which the abovementioned problem does not occur or at least to a lesser extent.

According to the invention, this object is achieved with an image sensor as described in claim 1 that comprises a pixel array integrated on a thin-film transistor 'TFT' panel. The pixel array comprises a plurality of active pixels arranged in a matrix of rows and columns, and comprises a plurality of column lines to which outputs of pixels in the same column are coupled for the purpose of outputting pixel signals. Each of the column lines being driven between a first voltage and a second voltage lower than the first voltage.

The image sensor further comprises readout circuitry comprising a plurality of readout units, each readout unit being configured for reading out a respective column line through an input node of the readout unit.

The image sensor further comprises capacitive units, such as capacitors, for capacitively coupling each input node to its corresponding column line.

The readout circuitry is integrated on one or more semiconductor dies of a first type, and the capacitive units are integrated on one or more semiconductor dies of a second type. The one or more semiconductor dies of the first type have been manufactured using a first semiconductor process and each comprise low voltage components with which the readout circuitry is realized, the readout circuitry having a first maximum voltage rating. The one or more semiconductor dies of the second type have been manufactured using a second semiconductor process different from the first semiconductor process and each comprise high voltage components with which the capacitive units are realized, the capacitive units having a second maximum voltage rating higher than the first maximum voltage rating. A difference between the first voltage and the second voltage is higher than the first maximum voltage rating but smaller than the second maximum voltage rating. The voltage on the column line is limited between the first voltage and the second voltage. This voltage range should be large enough to allow for variations due to the signal swing during operation, but also large enough to accommodate threshold variations over the lifetime of the sensor.

Within the context of the present application, the maximum voltage rating of a component is defined as the maximum potential difference that may exist over a component while causing little to no degradation of the lifetime of the component. For example, a two-terminal component may be provided with +A Volt at one terminal and −B Volt at the other terminal. The voltage difference over this component is then computed as A+B. The maximum voltage rating in this case equals the sum of A and B for which little to no degradation of the lifetime occurs. It is noted that positive, negative, or zero Volts can be applied at the terminals.

By using a capacitive coupling between the input node and the column line it becomes possible to shift the voltages at the input node to values that do not damage the readout circuitry. More in particular, it can be prevented that the supply voltage used for operating the pixels and column lines is put on the input node of the readout circuitry. This enables the image sensor of the present invention to be implemented using TFT technology in combination with low voltage standard CMOS process technologies for realizing the readout circuitry. Furthermore, by arranging the capacitive units on one or more semiconductor dies of a second type, it becomes possible to use standard off-the-shelf low voltage readout circuitry semiconductor dies in combination with TFT panels that are operated using relatively high supply voltages.

The voltage on a column line will vary during operation due to light falling onto the pixel. This variation has a relatively short time scale that is related to the frame rate of the sensor. However, the voltage will also vary due to changes in the threshold voltage of the transistors on the TFT panel. These changes occur on a much larger time scale and may be due to the threshold voltage shifting as a result of radiation damage in case the image sensor is an X-ray image sensor. The threshold voltage can also shift due to negative or positive bias temperature instability. The threshold voltage may further differ among the transistors on the same panel due to process tolerances.

The threshold voltage shift and/or spread will impose limits on the voltage levels in between which the voltage on the column line will vary during image capturing. For example, the voltage on a column line may vary between Va and Va−Vsigmax, wherein Vsigmax is the maximum change in voltage on a column line due to light falling onto the pixel, and Va a reference level. Typically, Vsigmax is fixed. However, Va may vary due to the abovementioned threshold voltage shift and/or spread. For example, referring to FIG. 2, Va may equal Vdd minus the threshold voltage of source follower SF.

By appropriately choosing the first voltage and second voltage, it can be ensured that voltages Va and Va−Vsigmax can be realized on each of the column lines of the TFT panel over time to avoid losing dynamic range. However, the absolute values for both Va and Va−Vsigmax may be too high or too low for the readout circuitry to process directly. According to the invention, this problem is mitigated by using capacitive units that are manufactured using a different process than the readout circuitry. For example, the capacitive units are made in a high-voltage CMOS process and the readout circuitry is made in a low-voltage CMOS process.

The image sensor may further comprise a row controller for selecting pixels among the plurality of pixels for readout. The image sensor may further comprise, for each pixel, a source follower for buffering the pixel signal and a select transistor for outputting the buffered pixel signal onto the corresponding column line in dependence of a row select signal outputted by the row controller. Additionally, the image sensor may comprise, for each column line, a source follower load, such as a current source or resistor.

The first voltage may be the voltage that is applied to the drain of the source follower. Additionally or alternatively, each source follower load is connected in between a respective column line and a reference node, wherein the second voltage may be the voltage that is applied to the reference node. Typically, the reference nodes for the column lines are identical and the voltages that are applied to the drains of the source follower are identical.

Furthermore, the image sensor may further comprise, for each pixel, a photodiode arranged in between a signal node and a node that is kept at a first reference voltage such as ground. Each pixel may further comprise a storage capacitor configured for accumulating charge due to a photocurrent generated by the photodiode, and a reset transistor coupled in between the photodiode and a second reference voltage and being configured to set a voltage on the signal node to the second reference voltage in dependence of a reset signal outputted by the row controller. In some embodiments, the storage capacitor is solely formed by the internal capacitance of the photodiode whereas in other embodiments an additional capacitor is arranged parallel to the photodiode. Such additional capacitor could be advantageous if the internal capacitance of the photodiode is too small to achieve the desired full well capacity.

The first reference voltage can be ground and the second voltage can be a negative voltage. In this case, the voltage headroom required for accommodating voltage levels Va and Va−Vsigmax is mainly achieved by appropriately choosing a sufficiently low second voltage. Alternatively, the first reference voltage can be a positive non-zero voltage and the second voltage can be ground. By using a higher first reference voltage, Va is shifted up. Provided that the first voltage is sufficiently high, the required voltage headroom can be realized although the source follower load is connected to ground.

The abovementioned source follower loads can be integrated on the same one or more semiconductor dies of the second type as the corresponding capacitive units. This offers the advantage that standard TFT panels can be used instead of TFT panels on which the source follower loads are implemented. Accordingly, by using semiconductor dies of the second type on which the capacitive units and the source follower loads are both integrated, it is possible to use already available TFT panels that operate at relatively high voltages, e.g. 10V or higher, in combination with low voltage readout integrated circuit dies that operate at considerably lower voltages, e.g. <3V, without risking damaging the readout circuitry. However, the present invention does not exclude embodiments wherein the source follower loads are integrated on the TFT panel.

The readout circuitry may be composed of a plurality of first segments, each first segment corresponding to a plurality of column lines and being integrated on a respective semiconductor die of the first type. The first segments may be identical to each other. The image sensor may further comprise a plurality of first flex foils by which the TFT panel is connected to an external device, wherein the respective semiconductor dies of the first type are arranged on respective first flex foils. The semiconductor die(s) of the second type on which the capacitive units and the source follower loads, when applicable, are integrated that correspond to the column lines that are associated with a given first segment among the plurality of first segments are preferably arranged on the same first flex foil as the semiconductor die of the first type that corresponds to said given first segment. The external device may for example be a device that collects the various readouts for the pixel array and constructs an image based on the readouts.

The row controller may comprise a plurality of second segments, wherein each second segment corresponds to a plurality of rows of the pixel array. These second segments may be identical. Each second segment may further comprise a driver for outputting, for the plurality of rows, the row select signals and the select signals when applicable, and it may be integrated on a respective semiconductor die of a third type. The image sensor may further comprise a plurality of second flex foils by which the TFT panel is connected to a remainder of the row controller, wherein the respective semiconductor dies of the third type are arranged on respective second flex foils.

The first maximum voltage rating may be between 3 and 6 Volt, more preferably between 3.5 and 5.7 Volt, and the second maximum voltage rating may be between 10 and 100 Volt, more preferably between 10 and 50 Volt, and wherein a difference between the first and second voltage is between 7.5 and 15 Volt, more preferably between 8 and 12 Volt.

The first flex foils may each comprise n inputs each connected to a respective column line on the TFT panel. Each first flex foil may comprise n conductive tracks on a flexible substrate. Connection to these tracks is possible, for example by a bumping technology, allowing a semiconductor die of the first type and second type to be arranged on and electrically connected to the first flex foil. Using multiple first flex foils and corresponding semiconductor dies, each column line of the pixel array can be read out.

The TFT panel can be based on amorphous silicon, low-temperature polycrystalline silicon, or indium gallium zinc oxide. These materials are deposited on a substrate for example a glass panel. The photosensitive elements may equally be formed depositing a photosensitive material, such as amorphous silicon or amorphous selenium, onto the substrate. Additionally or alternatively, the image sensor may further comprise a scintillator layer arranged above the pixel array. Such layer may be used for indirect conversion image sensors. Additionally or alternatively, the one or more semiconductor dies of the first, second, and/or third type can be based on complementary metal-oxide-semiconductor 'CMOS' technology. For example, the first semiconductor process can be a 3.3V or 5V digital CMOS process, and the second semiconductor process can be a 16V, 42V or 48V bulk or SOI BCD process, for instance a process that is originally targeting automotive applications.

The image sensor can be configured to perform, for each selected pixel, a correlated double sampling measurement 'CDS' scheme based on first and second pixel readouts. For example, the first pixel readout may correspond to a pixel being read out a predetermined amount of time after the pixel was reset, and the second pixel readout may correspond to a pixel being read out directly after having been reset. Typically, the predetermined amount of time, also referred to as the integration time, is sufficient to fully use the available voltage swing of the pixel voltage when the pixel array is irradiated with a corresponding maximum dose. Typically the pixel array is read out and reset, row by row. After the entire pixel array has been read out and reset, the X-ray source or other source of electromagnetic radiation creates an exposure flash and the pixels integrate light. After a predetermined amount of time, the pixels are read out and reset row by row. In this first pixel readout, the sample that is taken is referred to as the signal level. Immediately afterwards, the pixel is reset and a second sample is obtained. This second sample is referred to as the reference level for the CDS scheme.

It should be noted that the invention is not limited to a particular temporal order of the first and second pixel readouts. Put differently, embodiments are also possible in which the second pixel readout is performed earlier in time than the first pixel readout.

The readout circuitry may comprise a plurality of analog-to-digital converters 'ADCs'. For example, a single ADC may be provided for each column line. Alternatively, column parallel CDS circuits may be used that are followed by a multiplexer. This multiplexer directs the inputs received from the CDS circuits associated with a plurality of column lines into one or more high speed ADCs. In this case, one ADC may be used for converting signals for more than one column line.

The readout circuitry may be configured to read out the column lines based on a charge mode readout. For example, each readout unit may be configured to set a voltage on the input node equal to a third reference voltage during the first pixel readout and second pixel readout. Each readout unit may be configured to determine an output voltage based on a charge transfer during the second pixel readout to or from the capacitive unit. More in particular, each readout unit may comprise a charge amplifier comprising an operational amplifier, having an non-inverting input connected to the third reference voltage, and an inverting input connected to the capacitive unit via a first switch. An output of the operational amplifier may be coupled to the inverting input via a feedback capacitor. Each readout unit may further comprise a second switch arranged between the output and the inverting input of the operation amplifier. In addition, the readout circuitry may comprise a plurality of analog-to-digital converters 'ADCs' coupled to the outputs of the operational amplifiers of the readout units. The image sensor may comprise a second controller which is configured for controlling the first and second switches such that the voltage at the input node is set to the third reference voltage by closing the first and second switches during the first pixel readout, and such that the second switch is open when performing the second pixel readout. The second controller may be further configured to control the first switch to be open when an output of the operational amplifier is converted by an ADC among the plurality of ADCs.

Alternatively, the readout circuitry may be configured to read out the column lines based on a voltage mode readout. For example, each readout unit may be configured to set a voltage on the input node equal to a fourth reference voltage during the first readout and to determine an output voltage based on an change in voltage of the input node with respect to the fourth reference voltage during the second pixel readout. More in particular, each readout unit may further comprise a voltage setting unit for setting a voltage on the input node to the fourth reference voltage during the first pixel readout, and for providing a high impedance state during the second pixel readout to allow the voltage on the input node to track the pixel voltage when changing from a value corresponding to the first pixel readout to a value corresponding to the second pixel readout.

The readout circuity may comprise a plurality of analog-to-digital converters 'ADCs'. An exemplary embodiment of a readout unit based on voltage mode readout may comprise a first operational amplifier having a non-inverting input connected via a third switch to the fourth reference voltage and an inverting input connected to an output of the operational amplifier. It may further include a charge amplifier that comprises a second operational amplifier having a non-inverting input connected to a fifth reference voltage and an inverting input that is connected via a series capacitor and series fourth switch to the output of the first operational amplifier, and connected via a parallel connection of a feedback capacitor and fifth switch to an output of the second operational amplifier, wherein the output of the second operational amplifier is connected to an ADC among the plurality of ADCs. The readout circuitry may further comprise a third controller configured to control the third switch to be closed during the first pixel readout and to be open during the second pixel readout, to control the fourth switch to be closed during the first and second pixel readouts and to be open after the second pixel readout to allow an output of the second operational amplifier to be converted by the connected ADC, and to control the fifth switch to be open during the first pixel readout and to be closed during the second pixel readout.

In an embodiment, the timing signals of the readout circuitry are synchronized to the timing of the row controller by a main controller that is generally arranged outside of the readout circuitry and TFT panel. This main controller may correspond to the second or third controller described above. Typically, the main controller is a field programmable gate array 'FPGA' or a microcontroller and may be arranged off the panel and outside of the readout circuitry. The row controller can be embodied as a gate driver containing a shift register to select a row and a few gates to control the reset and row select lines. The timing of the reset and row select lines for the row that is pointed to by the shift register can be controlled with a few digital signals provided to the gate driver by the FPGA or microcontroller. The FPGA or microcontroller may also provide clock and data input signals for the shift register. The FPGA may also provide timing synchronization signals to the readout circuitry to ensure that the readout circuitry and the gate driver operate synchronously.

According to a second aspect, the present invention provides an imaging system comprising the image sensor as described above and a processing unit for constructing an image based on outputs from the readout circuitry. The imaging system can be configured for constructing X-ray images of an object. In this case, the imaging system may further comprise an X-ray source positioned such that the object to be imaged can be arranged in between the X-ray source and image sensor.

Next, the invention will be described in more detail, wherein.

Figure 3A:
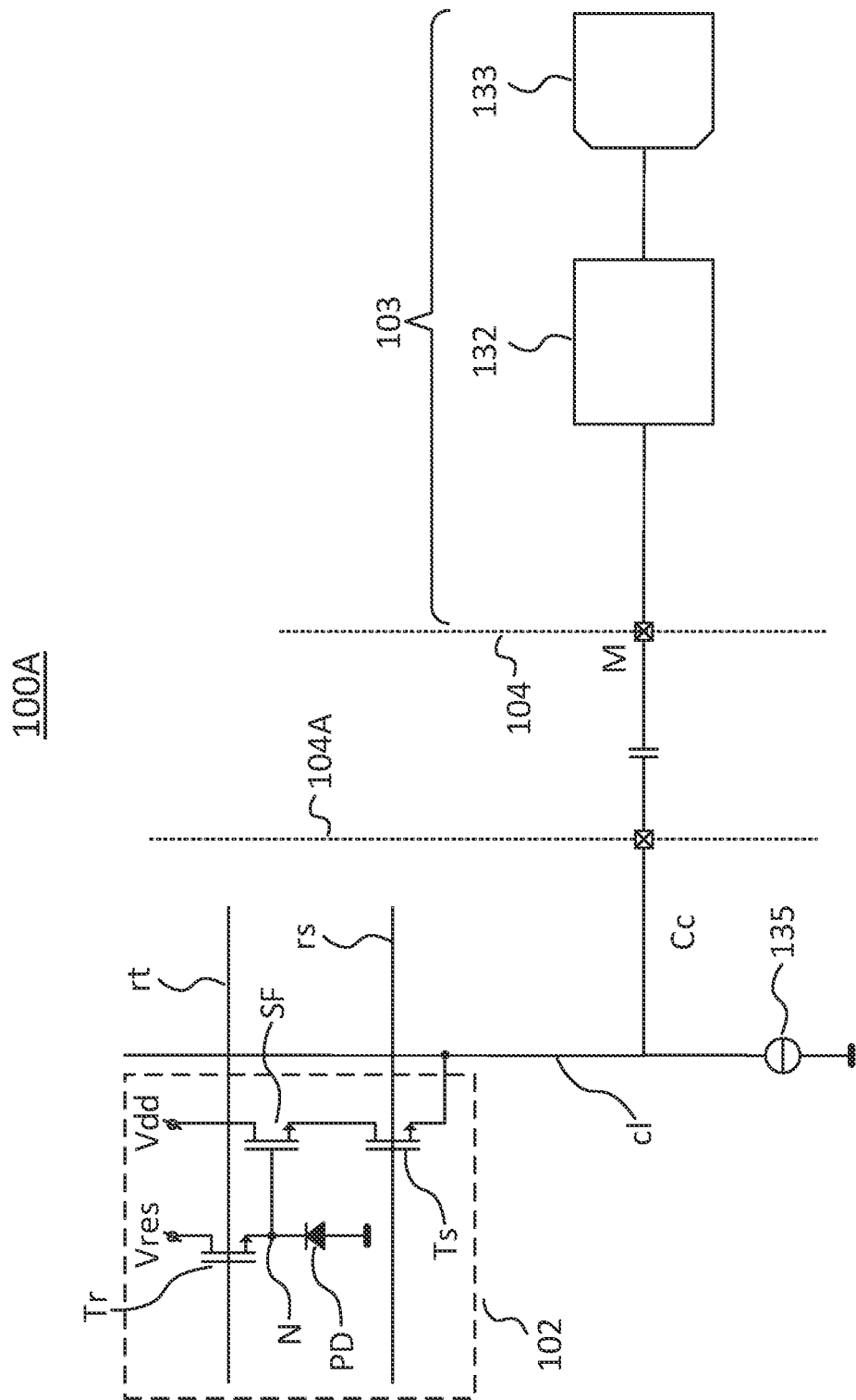
Figure 3B:
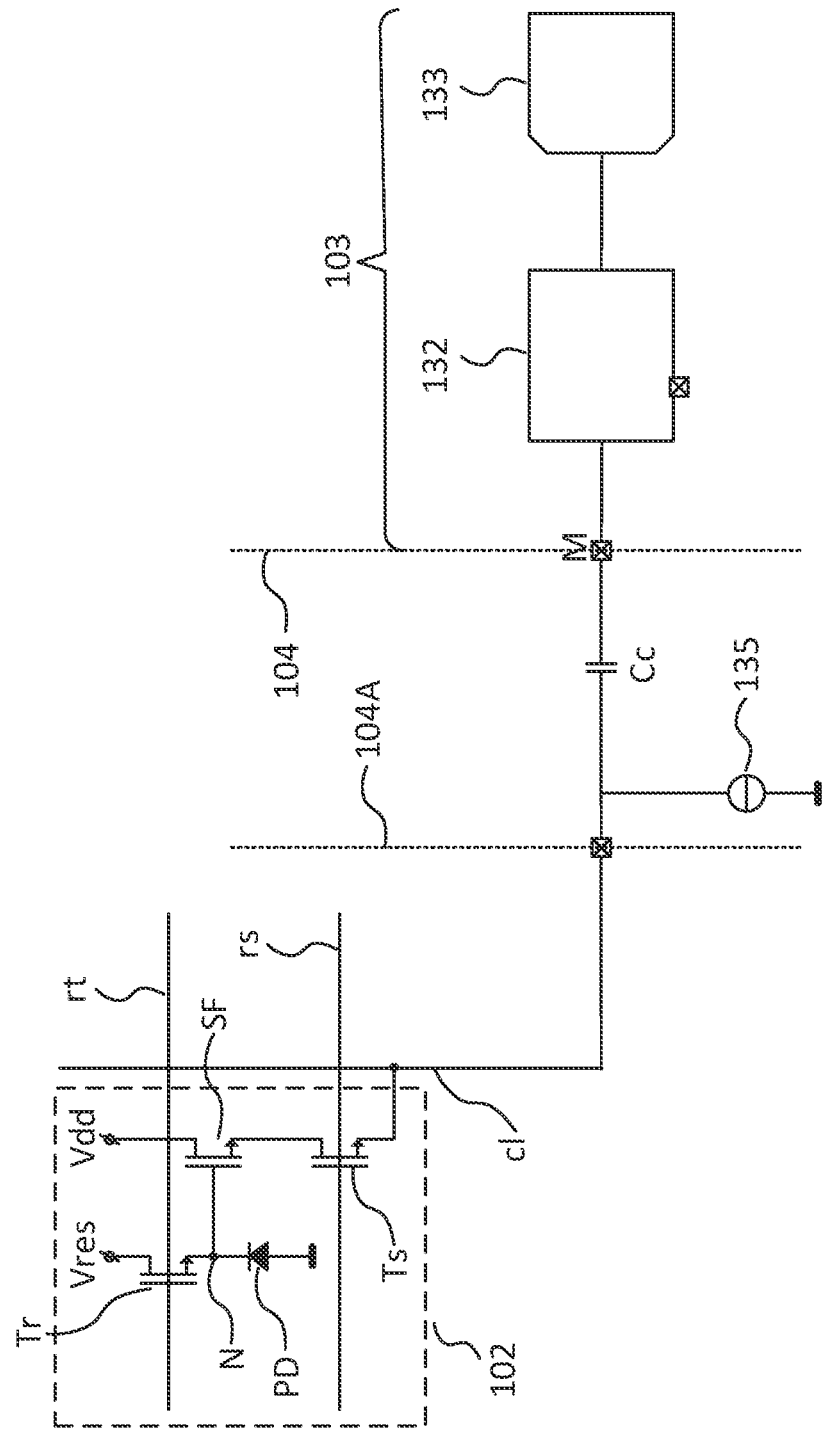
Figure 4:
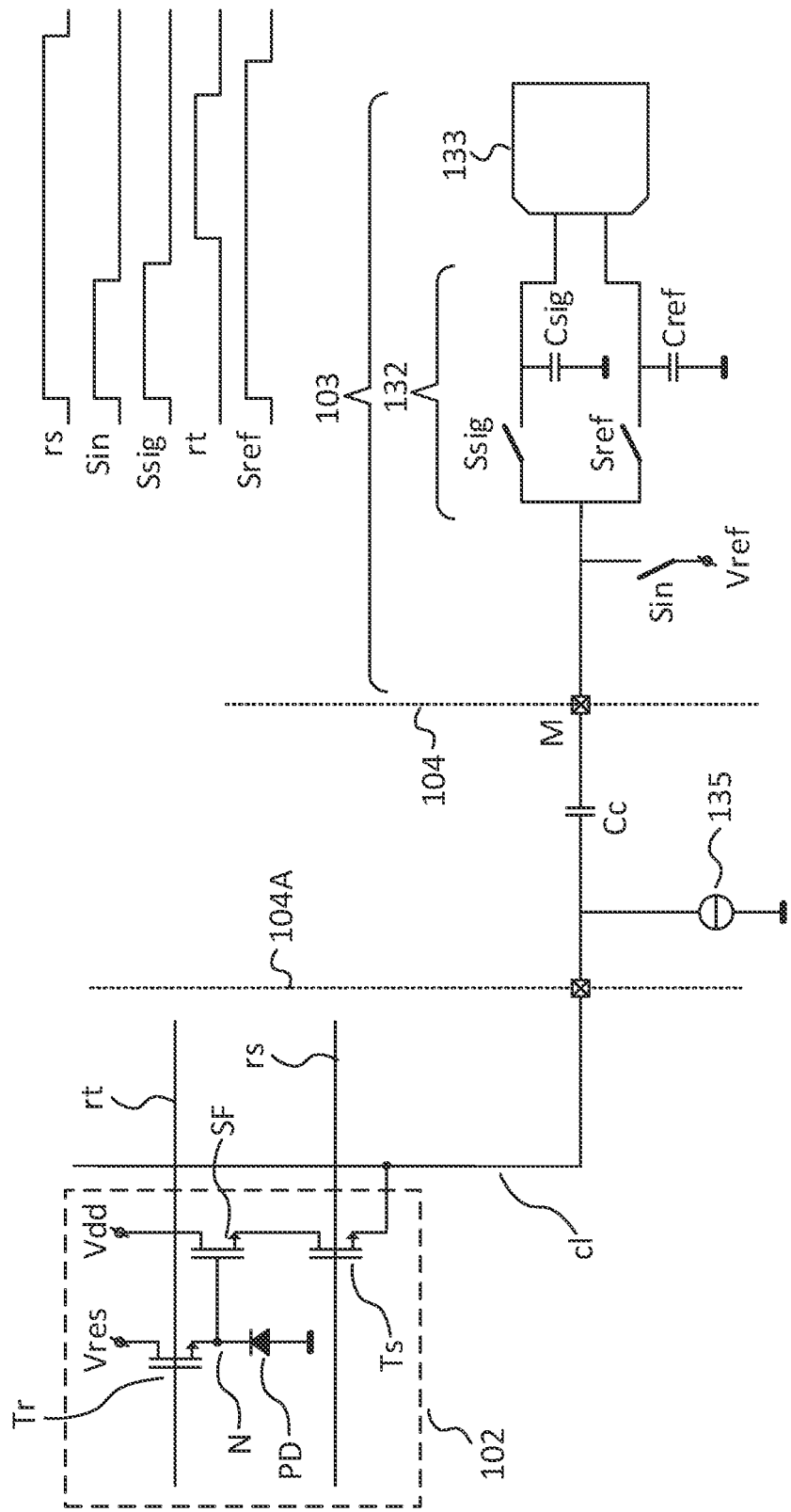
Figure 5:
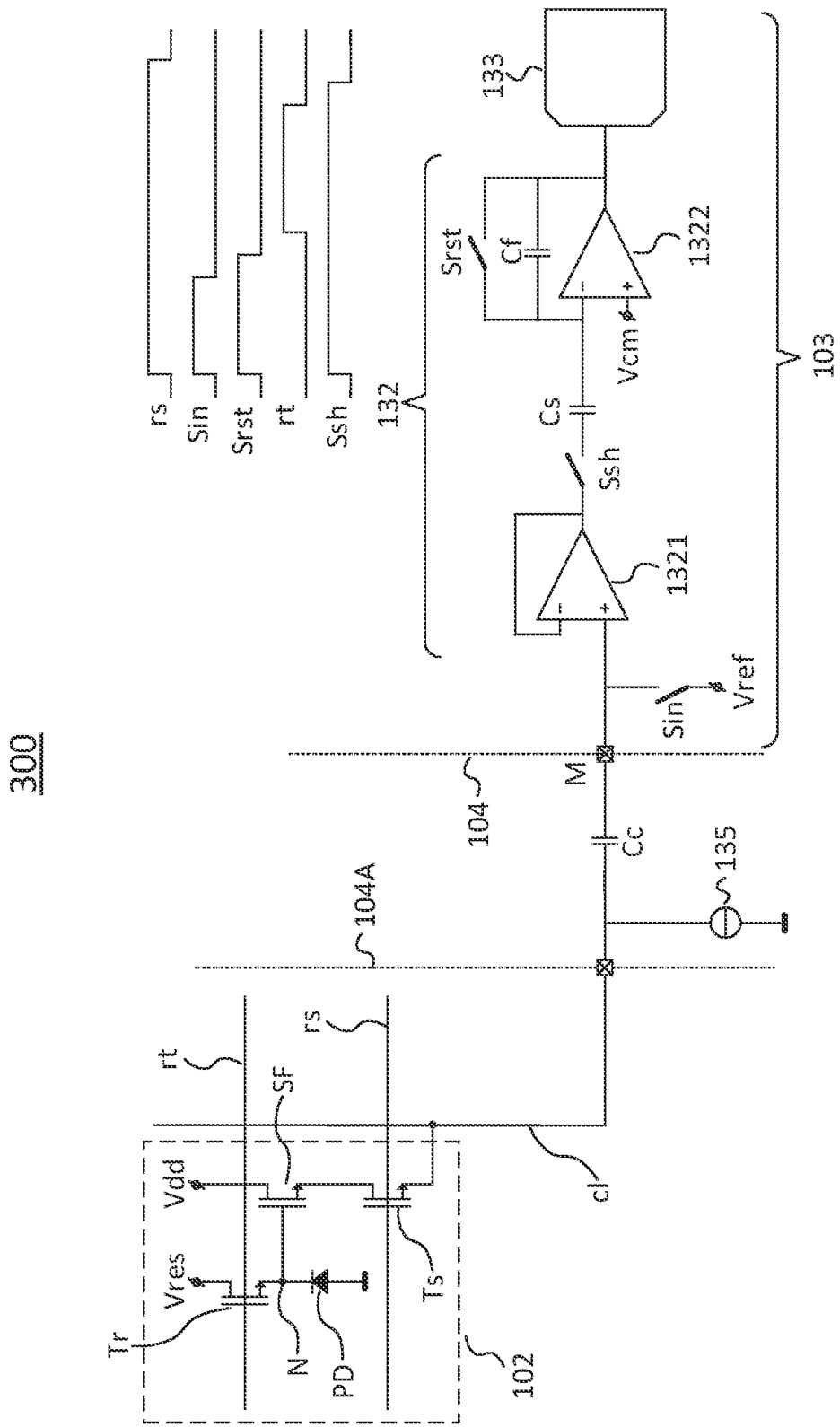
Figure 6:
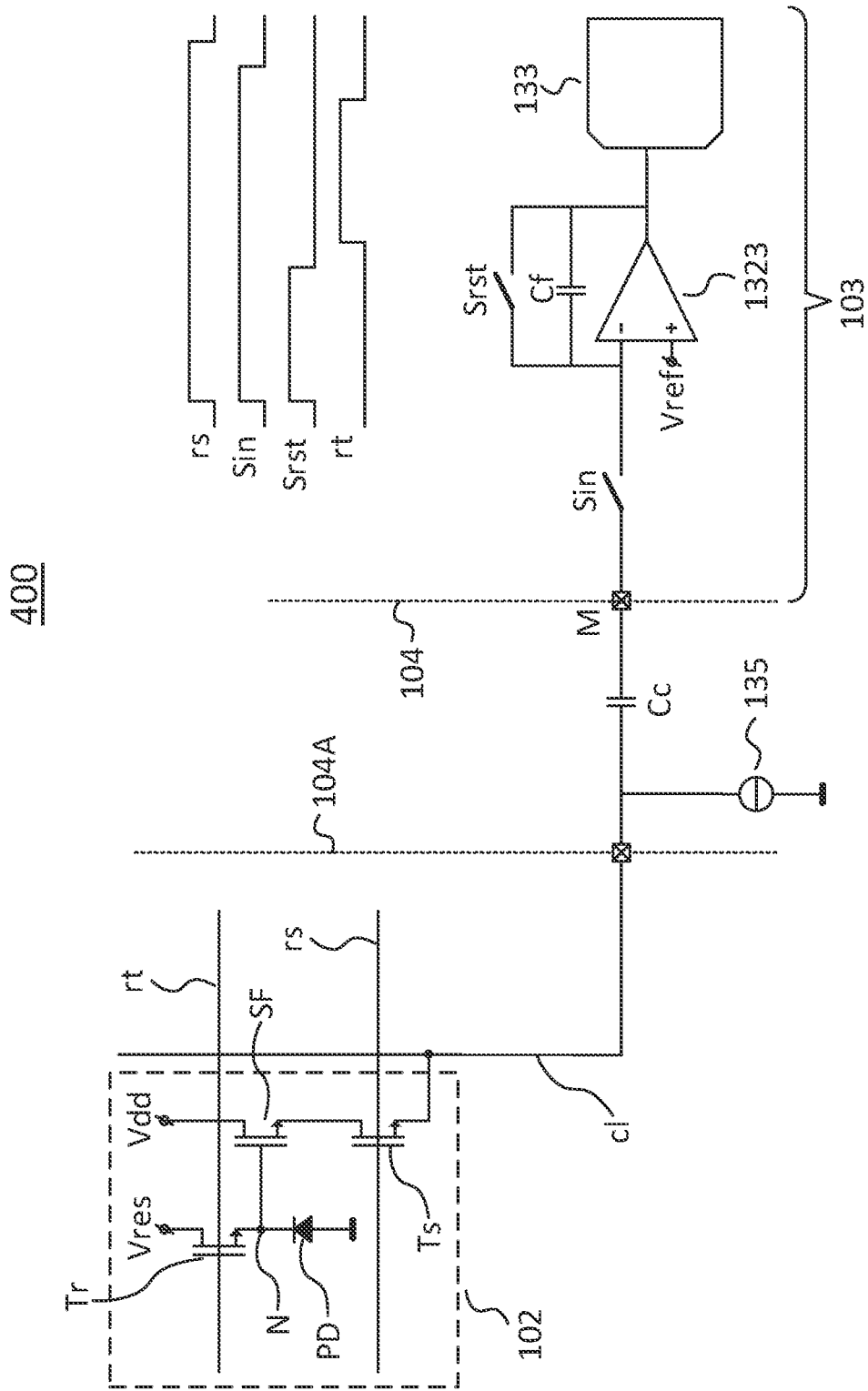
Figure 7:
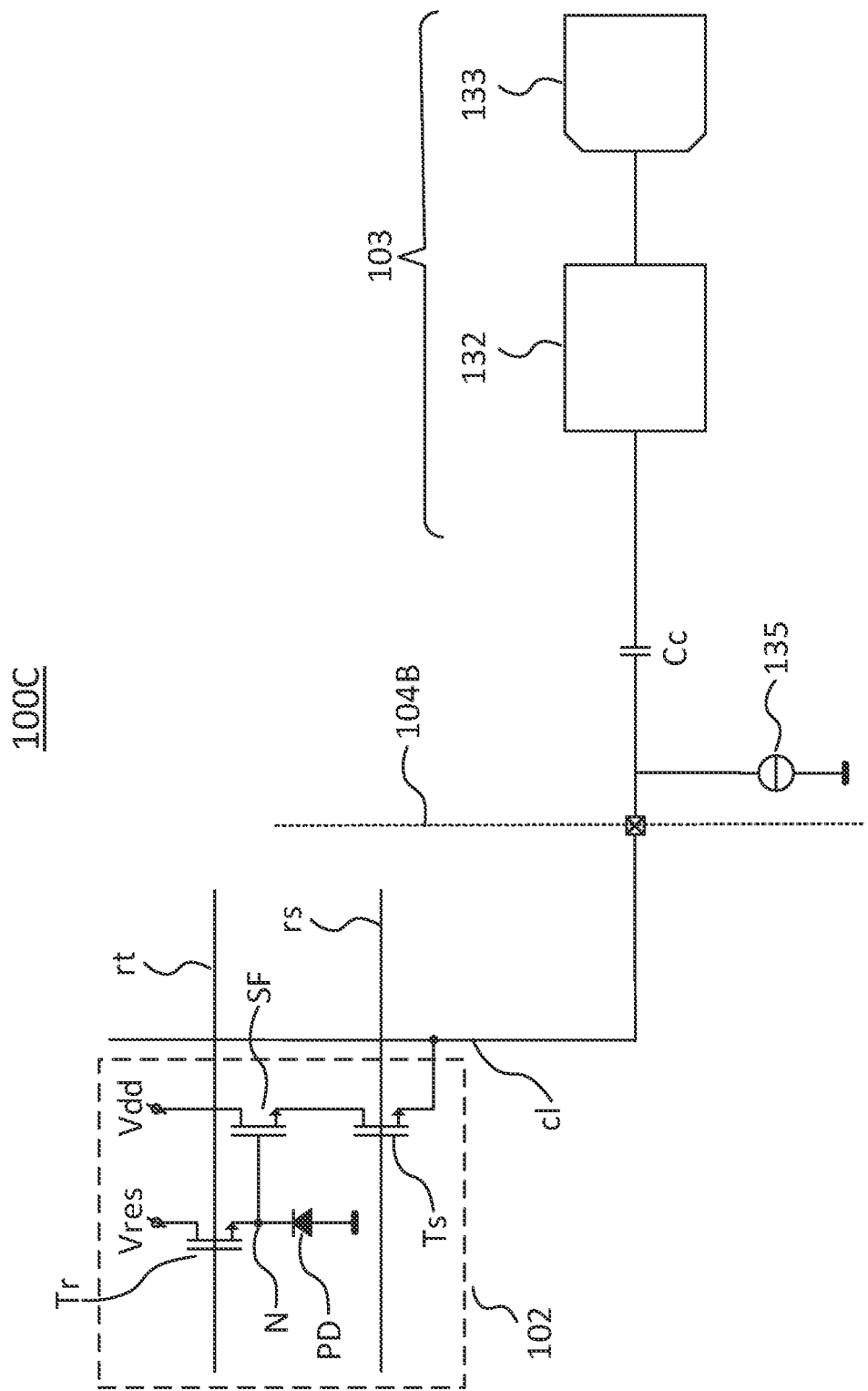
Figure 8:
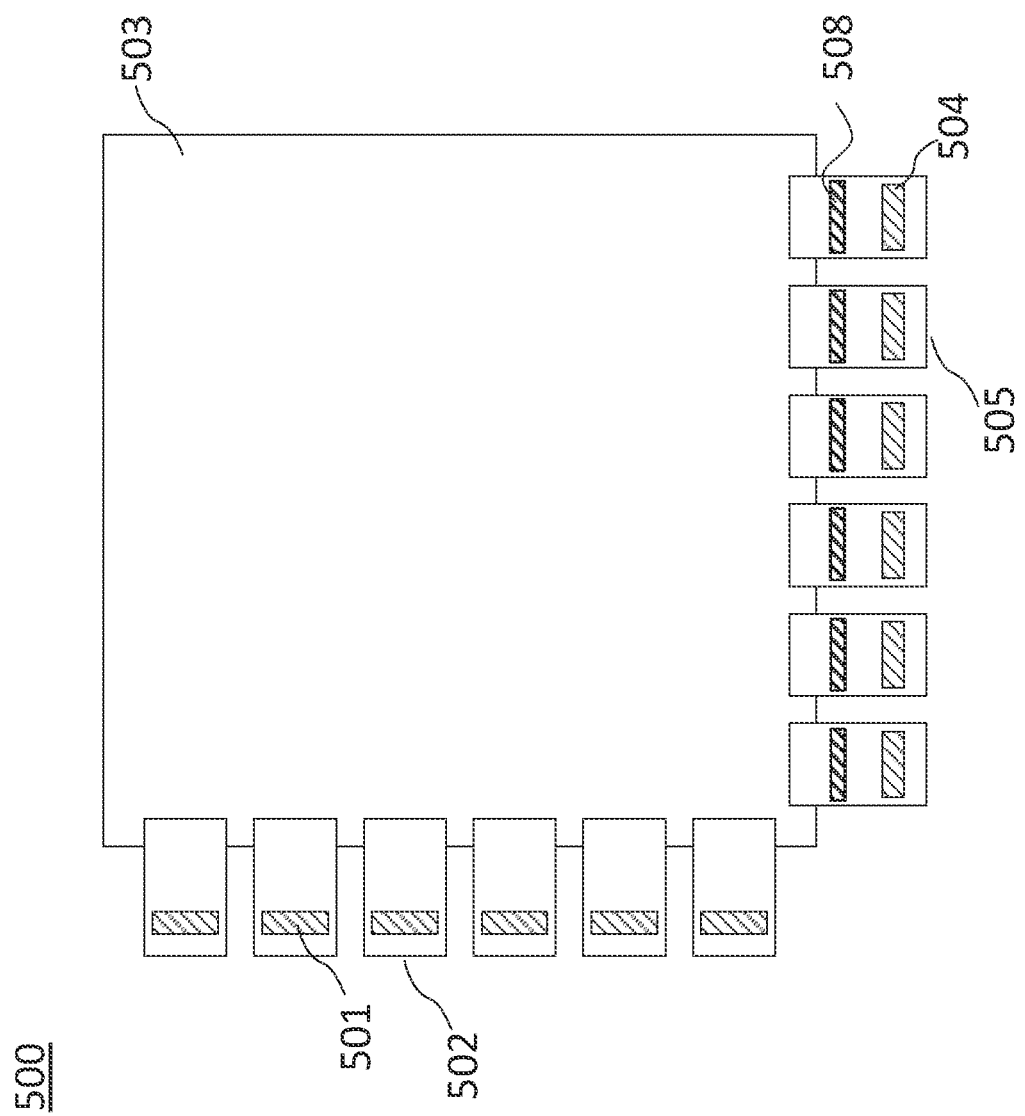
Figure 9:
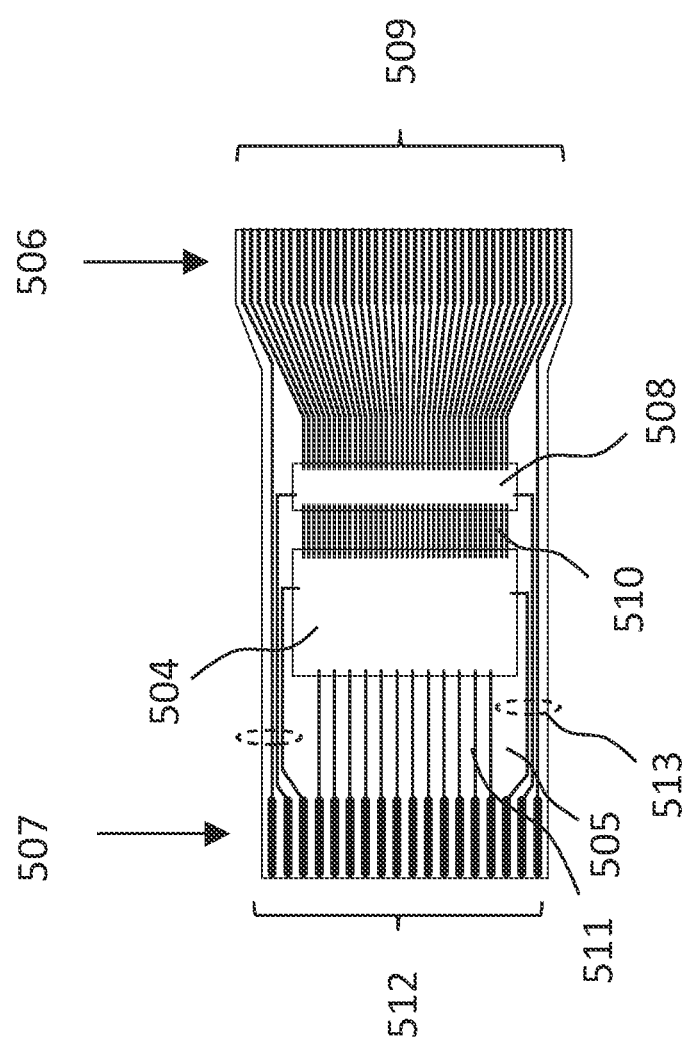

FIGS. 3A and 3B schematically illustrate a first and second example of a TFT based image sensor in accordance with the present invention, respectively;

FIG. 4 illustrates an embodiment of an image sensor according to the invention using voltage mode readout;

FIG. 5 illustrates a further embodiment of an image sensor according to the invention using voltage mode readout;

FIG. 6 illustrates an embodiment of an image sensor according to the invention using charge mode readout;

FIG. 7 illustrates a third example of a TFT based image sensor in accordance with the present invention;

FIG. 8 illustrates a layout of an embodiment of an image sensor in accordance with the present invention;

FIG. 9 illustrates a detailed view of the flex foils used in the image sensor of FIG. 8; and FIG. 10 illustrates an X-ray imaging system in accordance with the present invention.

Figure 1:
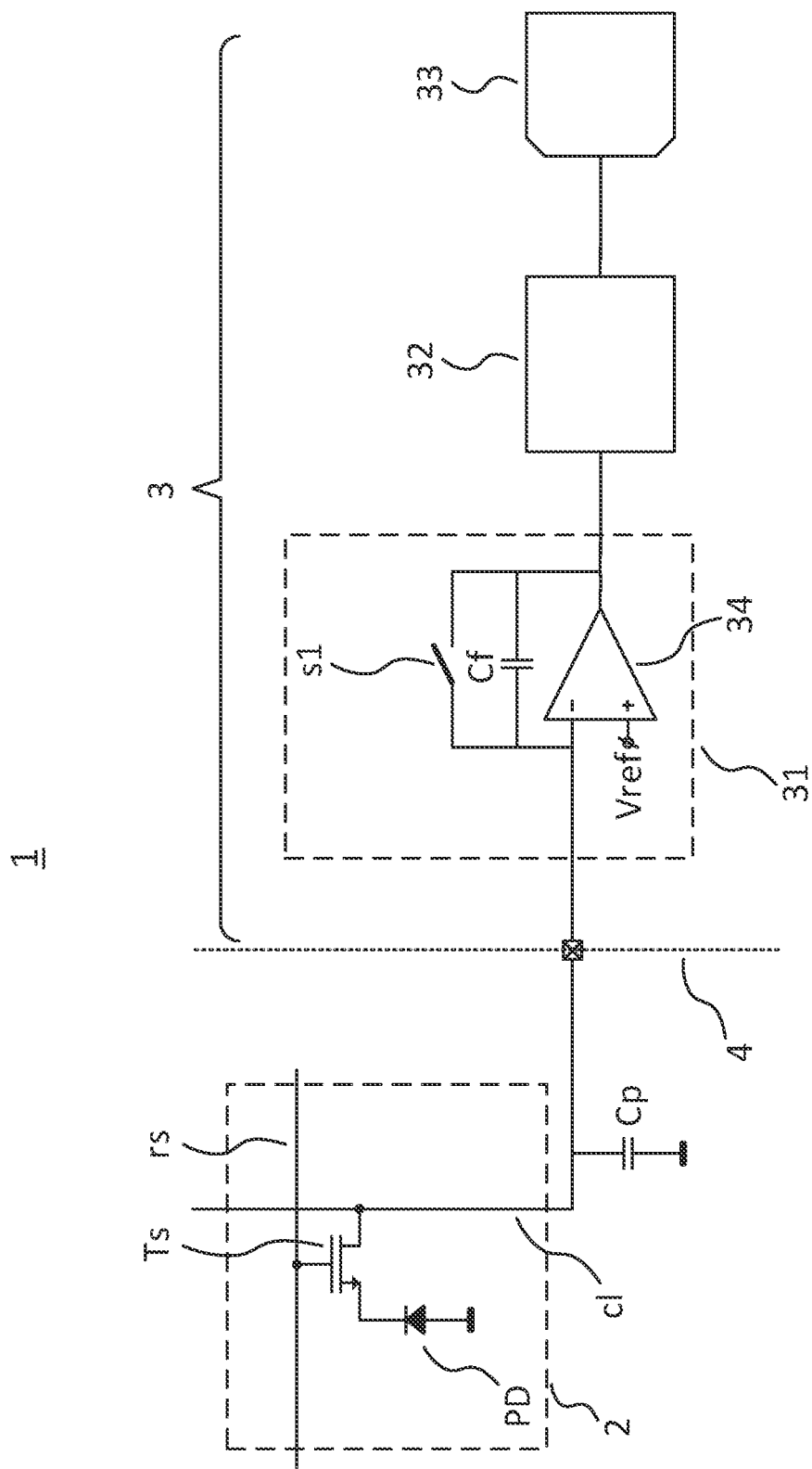
FIG. 1 illustrates an example of a known TFT based image sensor using passive pixels.
Figure 2:
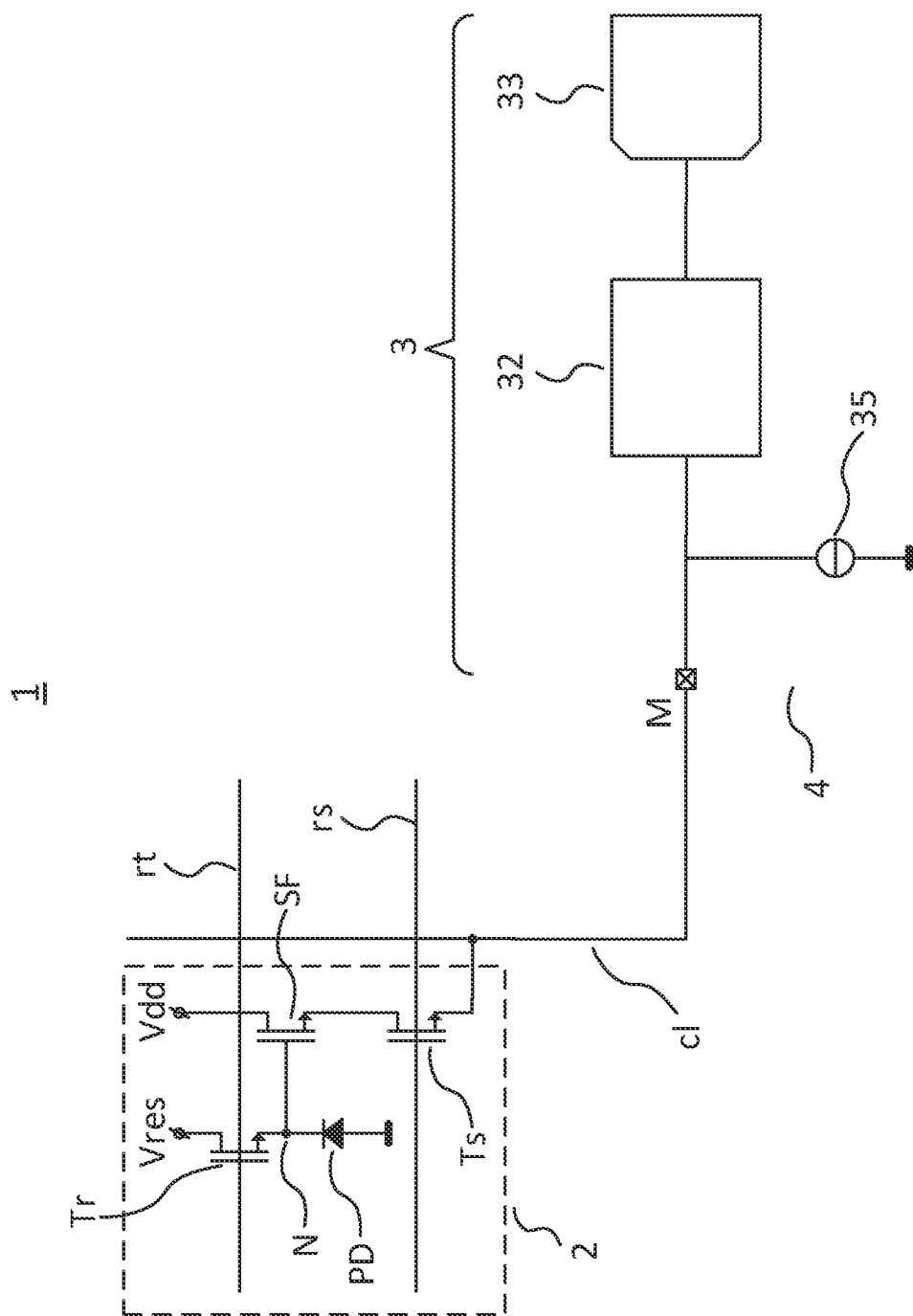
FIG. 2 illustrates an example of a known image sensor using active pixels.

FIG. 3A schematically illustrates a first example of a TFT based image sensor in accordance with the present invention. More in particular, an embodiment of an image sensor 100A in accordance with the present invention comprises, similar to the image sensor of FIG. 2, a pixel array of which a single active pixel 102 is shown in FIG. 3. Active pixel 102 comprises a reset transistor Tr controlled via a reset line rt, a select transistor Ts controlled via a row select line rs, and source follower SF.

Readout unit 103 having an input node M comprises a correlated double sampling unit 132 and an ADC converter 133.

FIG. 3A indicates a dotted line 104 and a dotted line 104A. The components illustrated to the right of dotted line 104 are implemented on a semiconductor die of a first type, e.g. based on readily available CMOS technology. The components illustrated in between dotted lines 104 and 104A are implemented on a semiconductor die of a second type, e.g. based on high-voltage CMOS technology. Finally, the components illustrated to the left of dotted line 104A are implemented on the TFT panel.

As shown, current source 135, acting as a load for source follower SF, is arranged on the TFT panel.

The capacitive coupling between input node M and column line cl is provided by capacitor Cc, which is formed on the semiconductor die of the second type. This capacitor provides a voltage level shift between input node M and column line cl. Capacitor Cc can be implemented as a metal-insulator-metal capacitor, a metal-oxide-semiconductor capacitor or the like.

Photodiode PD will generally perform optimally if it is reset to for example 5V between its cathode and anode. In FIG. 3A, the anode is at ground. This implies that Vres should be 5V. However, the gates of reset transistor Tr and select transistor Ts may have to be pulsed to for instance 10V or 25V to get a low ON-resistance.

The 5V on photodiode PD defines the reset level. Column line cl will be at 5V minus the Vgs of source follower SF during the reference level sampling. For the signal level sampling, column line cl will be at 5V−Vgs−Vsig. If there is a large threshold level shift, column line cl may be below 0V. This may be a problem for current source 135 if it is connected between column line cl and ground. There are two solutions for this problem.

As a first solution, the bottom terminal of current source 135 can be connected to a negative potential. As a second solution, instead of connecting the anode of photodiode PD to 0V as shown in FIG. 3A, it can be connected to 5V. This implies that Vres of the pixel has to be raised to 10V. Similarly, Vdd has to be raised to at least 10V. These higher voltages on column line cl are however blocked by capacitor Cc.

As described above, there are multiple voltages used for the TFT panel, such as the ON voltage on the gates (e.g. +25V), the OFF voltage on the gates, e.g. −5V, and the Vres and Vdd of the pixel.

During operation, the voltage on column lines cl of the TFT panel varies over a range of a few volts due to the signal and in addition to that over a range of quite a few volts due to threshold variation. In practice, a voltage range of about 10V has found to be sufficient to accommodate for the threshold variation.

Capacitor Cc will have to block the above mentioned 10V range. Therefore, capacitor Cc, which is implemented in the semiconductor die of the second type, should be able to withstand the voltages in this range and it should therefore be created in an IC with a voltage rating of for instance 12V or higher. The semiconductor die of the first type can however be realized using a low voltage semiconductor process.

In most circumstances, a negative supply is either unavailable or undesirable. It then becomes necessary to use the abovementioned second solution in which it is even more important that capacitor Cc blocks the potentially high voltages on column line cl from damaging readout unit 103.

According to the invention, threshold voltage variations are absorbed across the coupling capacitor Cc, such that these variations to not degrade the voltage headroom. Put differently, any threshold voltage variation of the TFT panel is stored on capacitor Cc such that readout unit 103 does not have to sacrifice voltage headroom for TFT threshold variation. A secondary goal is to isolate the low voltage readout unit, e.g. operating using 3.3V, from voltages that are potentially higher on the TFT panel, e.g. 10V.

Current source 135 can be embodied as a current mirror, where there is one transistor for each column in the panel.

FIG. 3B schematically illustrates a second example of a TFT based image sensor in accordance with the present invention. Compared to FIG. 3A, current source 135 is now also implemented on the semiconductor of the second type. In this manner, the TFT panel need not be equipped with current source 135 and readout unit 103 can be completely realized using standard low-voltage CMOS technology.

FIG. 4 illustrates an embodiment of an image sensor 200 according to the invention using voltage mode readout. FIG. 4 shows a relatively simple implementation of CDS unit 132. Moreover, in this embodiment, current source 135 and capacitor Cc are integrated on a semiconductor die of the second type similar to FIG. 3B.

As long as a pixel row is selected, the voltage on column line cl will always settle to a defined DC voltage. This settling may take some time but after settling, the DC voltage is substantially defined as the voltage on node N minus the threshold Vth of the source follower.

The operation of image sensor 200 will be explained referring to the timing diagram shown in the upper right corner of FIG. 4. Initially, the voltage on node N is Vres−Vsig, where Vres is the original potential after reset and Vsig is the amount that the potential has dropped due to exposure to light. The voltage on the left plate of Cc is Vres−Vsig−Vth, where Vth is the threshold of source follower SF. Here, it is assumed that the gate source voltage of source follower SF, which equals Vth plus a small overdrive, can be approximated by Vth. The voltage on the right plate of capacitor Cc is pulled via switch Sin to Vref. The voltage on capacitor Cc, Vcap, is thereby made equal to Vcap=Vres−Vsig−Vth−Vref.

After some time, when Vcap has settled, switch Sin opens as indicated by the negative edge of Sin in the timing diagram. From this point onwards, the voltage on the right plate of Cc tracks any shifts on the left plate. More in particular, due the high input impedance associated with input node M, there is substantially no current flowing into input node M from the side of capacitor Cc. With no current flowing through Cc, the voltage across Cc is constant. This implies that the voltage on the right plate just tracks the voltage on the left plate with a level shift equal to Vcap calculated above.

Shortly after opening Sin, Ssig opens and the signal level on Csig is sampled by CDS unit 132. The voltage on Csig is to a first order equal to Vref. To a second order, it is equal to Vref plus any charge injection that occurs when opening Sin and also the charge injection that occurs when opening Ssig.

After sampling the signal level on Csig by CDS unit 132, pixel 102 is reset. The voltage on node N then changes from Vres−Vsig to Vres. The voltage on column line cl changes from Vres−Vsig−Vth to Vres−Vth. This implies that the column voltage steps up with an amount Vsig. As a result, the voltage on Cref moves up from Vref to Vref+Vsig. After opening Sref, the signal level on Cref is sampled by CDS unit 132. By subtracting the second pixel readout from the first pixel readout, i.e. Vref−(Vref+Vsig)=Vsig, the component in the pixel signal associated with the amount of captured light can be extracted. This value can subsequently be converted into a digital number by ADC unit 133.

There is capacitive attenuation of the signal voltage due to capacitive division between Cc and Cref. However, because Cc>>Cref this attenuation can be neglected. Alternatively, a voltage buffer may be arranged in between input node M and switches Ssig and Sref to avoid the capacitive loading caused by Csig and/or Cref.

FIG. 5 illustrates a further embodiment of an image sensor 300 according to the invention using voltage mode readout. Also in this embodiment, current source 135 and capacitor Cc are integrated on a semiconductor die of the second type.

The operation of Cc and Sin is exactly the same as in FIG. 4. Moreover, the same reference signs will be used to refer to the same or similar components.

CDS unit 132 comprises a first operational amplifier 1321, which acts as a voltage buffer allowing the voltage step that occurs on the right hand plate of Cc when pixel 102 is being reset to be accurately tracked. The capacitive voltage division may be smaller with this implementation because only the input capacitance of the buffer loads column line cl.

CDS unit 132 further comprises a second operational amplifier 1322, which acts as a charge amplifier. The non-inverting input of amplifier 1322 is connected to a reference voltage Vcm and the inverting input is connected to the output of amplifier 1321 via a series connection of switch Ssh and capacitor Cs. The inverting input is further connected to the output of amplifier 1322 via feedback capacitor Cf. A switch Srst is arranged parallel to capacitor Cf and the output of amplifier 1322 is connected to ADC unit 133.

In this embodiment, when switch Sin is open, readout unit 103 has a high input impedance allowing the voltage step that occurs on the right hand plate of Cc when pixel 102 is being reset to be accurately tracked.

Initially, when column line cl is at Vres−Vsig—Vth, Sin forces the right plate of capacitor Cc to Vref. At this time, because Srst of CDS unit 132 is closed, a voltage over capacitor Cs will be equal to Vref−Vcm. Subsequently, Sin opens and a voltage is sampled on Cc. After that, Srst opens. This ends the reset of capacitor Cf Now, if pixel 102 is reset using reset line rt, there will be a voltage step with an amount Vsig on input node M, which is also reflected at the right plate of Cc and the left plate of Cs. Because the right plate of Cs is fixed at Vcm, this causes a current through Cs that also flows through Cf. As a result, the output of CDS unit 132 changes from Vcm, the level during the reset, to Vcm−Vsig×Cs/Cf. This demonstrates that CDS unit 132 acquires the pixel signal voltage with a gain that depends on the capacitance ratio and that it level shifts the signal voltage to a new reference level Vcm. Vcm can be chosen at any convenient voltage level for CDS unit 132 and ADC unit 133 to prevent electrical breakdown of components in these units. For example, Vcm can be set to a voltage level above 0V that can be easily reached by amplifier 1322 to avoid the need for a negative supply voltage for amplifier 1322.

When switch Ssh opens, there can no longer be any current flow through Cs and therefore also no current flow through Cf. This freezes/samples/stores the signal voltage on the output of CDS unit 132 for subsequent ADC conversion by ADC unit 133.

FIG. 6 illustrates an embodiment of an image sensor according to the invention using charge mode readout. Again, in this embodiment, current source 135 and capacitor Cc are integrated on a semiconductor die of the second type. Furthermore, in this case, readout unit 103 comprises a charge amplifier formed using an operational amplifier 1323, but together with switches Srst and Sin and the timing signals, the charge amplifier actually implements a CDS operation. This CDS operation is quite similar to the operation of CDS unit 132 described in conjunction with FIGS. 4 and 5.

Initially, the left plate of Cc is at Vres−Vsig−Vth. Initially Sin and Srst are ON which allows operational amplifier 1323 to force a voltage equal to Vref on the right plate of Cc, which voltage may for example correspond to a voltage between the supply rails of amplifier 1323. Subsequently, Srst opens. After that, operational amplifier 1323 can only affect the voltage on input node M by forcing a current into feedback capacitor Cf Subsequently pixel 102 is reset. This shifts the column line voltage from Vres−Vsig−Vth to Vres−Vsig. The inverting input of operational amplifier 1323 remains constant at Vref. Therefore the voltage across Cc changes with an amount Vsig. This change in voltage implies a change in charge equal to Cc×Vsig. Therefore a charge should flow through Cf into Cc. This charge causes the potential at the output of operational amplifier 1323 to decrease from Vref to Vref−Vsig×(Cc/Cf). Eventually, Sin can be opened to isolate operational amplifier 1323 from column line cl. From this point onward, there can be no current flowing into input node M thereby freezing the output voltage of operational amplifier 1323. This output voltage can be processed by ADC unit 133.

The ADC unit 133 depicted in FIGS. 4-6 could be a column parallel ADC or an ADC that is shared between multiple columns of the pixel array.

In the embodiments shown in FIGS. 5 and 6, the value of Cc is affecting the gain of CDS unit 133. The value of Cc can vary from column to column. This causes a column gain pattern. The value of Cc is constant over temperature/lifetime making it convenient to remove the gain pattern by a calibration such as a flat-field correction FIG. 7 illustrates a third example of a TFT based image sensor in accordance with the present invention. Compared to the examples in FIGS. 3A and 3B, the components to the right of dotted line 104B, i.e. capacitor Cc, current source 135 and readout unit 103, are now implemented in a semiconductor die of a mixed type. Here, the wording mixed type refers to the fact that in one semiconductor technology, e.g. CMOS, both low voltage and high voltage components are available. The high voltage components, i.e. components that can withstand high voltages, are used for realizing current source 135 and capacitor Cs, whereas the low voltage components are used for realizing readout unit 103.

FIG. 8 illustrates a layout of an embodiment of an image sensor 500 in accordance with the present invention. This layout may apply to the examples shown in FIG. 3A or FIG. 3B depending on whether current source 135 is or is not implemented on the TFT panel.

On the right side, row driver integrated circuits 501, formed by semiconductor dies of the third type, are arranged on flex-foils 502 that are bonded to TFT panel 503 on which the pixel array and optionally current sources 135 is/are arranged. Circuits 501 control the row select lines and reset lines. More in particular, each integrated circuit 501 drives the row select lines and reset lines for a plurality of rows of pixels. These circuits are part of the row controller. In an embodiment, the row controller is substantially completely formed by circuits 501. In other embodiments, the row controller may comprise additional circuitry that is arranged remote from panel 503 and flex foils 502. For example, panel 503 can be mounted to a separate printed circuit board (not shown) wherein electrical connection between circuitry on the printed circuit board and panel 503 is obtained via flex foils 502. In such case, the abovementioned additional circuitry can be realized on the printed circuit board. It is also possible to split the column lines in the center of the array. If the column lines are each split into a top and bottom half, then there should be readout circuitry on both sides of the pixel array to read out the top half of the pixel array connected to the top half of the column line and the bottom half of the pixel array connected to the bottom half of the column line. This method doubles the amount of circuitry, but also increases the overall speed of the detector by a factor two.

Regardless of a column line split, it is also possible to drive the row select lines either from a single side or from both sides of the pixel array. Driving on two sides provides a speed advantage since effectively only half of the RC-load of the row select lines is loading the gate drives on either side of the pixel array.

The readout circuitry can also be divided into separate integrated circuits 504 that are mounted on flex foils 505. Also in this case, the readout circuitry can be completely formed by integrated circuits or part of the readout circuitry can be arranged on the printed circuit board. Furthermore, each integrated circuit 504 comprises readout units for multiple column lines. Similarly, integrated circuits 508 comprise capacitors Cc and optionally current sources 135 that are associated with the same column lines as integrated circuits 504. A more detailed view of flex foil 505 is illustrated in FIG. 9.

Instead of using semiconductor dies of the first and second types, a single semiconductor die of the mixed type may be used. However, this would require a costly high voltage semiconductor process to be used. In such case, the image sensor would comprise:

a pixel array integrated on a thin-film transistor 'TFT' panel and comprising a plurality of active pixels arranged in a matrix of rows and columns, and comprising a plurality of column lines to which outputs of pixels in the same column are coupled for the purpose of outputting pixel signals, each of the column lines being driven between a first voltage and a second voltage lower than the first voltage;

readout circuitry comprising a plurality of readout units, each readout unit being configured for reading out a respective column line through an input node of the readout unit;

wherein the image sensor further comprises capacitive units, such as capacitors, for capacitively coupling each input node to its corresponding column line;

wherein the readout circuitry and the capacitive units are integrated on one or more semiconductor dies of a mixed type, the readout circuitry having a first maximum voltage rating and the capacitive units having a second maximum voltage rating higher than the first maximum voltage rating;

wherein a difference between the first voltage and the second voltage is higher than the first maximum voltage rating but smaller than the second maximum voltage rating.

Alternatively, the capacitive units and source follower loads could both be integrated on the TFT panel. In this latter case, the image sensor would comprise:

a pixel array integrated on a thin-film transistor 'TFT' panel and comprising a plurality of active pixels arranged in a matrix of rows and columns, and comprising a plurality of column lines to which outputs of pixels in the same column are coupled for the purpose of outputting pixel signals;

readout circuitry comprising a plurality of readout units, each readout unit being configured for reading out a respective column line through an input node of the readout unit;

capacitive units, such as capacitors, for capacitively coupling each input node to its corresponding column line;

a row controller for selecting pixels among the plurality of pixels for read-out;

for each column line, a source follower load, such as a current source or resistor; and for each pixel, a source follower for buffering the pixel signal and a select transistor for outputting the buffered pixel signal onto the corresponding column line in dependence of a row select signal outputted by the row controller;

wherein the readout circuitry is integrated on one or more semiconductor dies, and wherein the capacitive units and source follower loads are integrated on the TFT panel.

As shown in FIG. 9, flex foil 505 comprises a first end 506 that is connected to the TFT panel, and a second end 507 that is connected to an external device for image processing. Flex foil 505 comprises a plurality 509 conductive traces or tracks for connecting respective column lines of the TFT panel to the semiconductor die 508 of the second type that comprise capacitors Cc and optionally current sources 135. In general, flex foil 505 may comprise n traces to connect to n column lines on the TFT panel. Consequently, die 508 comprises n capacitors Cc and optionally n current sources 135. From die 508, another set of n traces 510 extends between die 508 and the die 504 of the first type on which readout unit 135 is integrated.

Flex foil 505 comprises m traces or tracks 512 for connecting the readout unit on die 504 to the external device. Among these m traces or tracks, some traces or tracks 511 are used for transporting the digital data outputted by readout unit 135, whereas other traces or tracks 513 are used for providing supply and reference (ground) voltages to dies 504, 508.

As shown in FIG. 9, it is not required that every column line corresponds to a respective conductive track 511 of contact 507. For example, semiconductor die 504 may use a serial interface for communicating data with the external device.

FIG. 10 illustrates an X-ray imaging system 1000 in accordance with the present invention. It comprises an X-ray source 1100 and an image sensor 1200 in between which an object 1300 to be imaged can be provided. A general controlling and processing unit 1400 may be provided for controlling X-ray source 1100 and image sensor 1200 and for constructing an X-ray image based on the output from image sensor 1200. Any of the image sensors presented in FIGS. 4-7 may be used as image sensor 1200.

In the above, the present invention has been explained using detailed embodiments thereof. However, the present invention is not limited to these embodiments. Various modifications can be made to these embodiments without departing from the scope of the invention which is defined by the appended claims and their equivalents.

For example, some direct conversion detectors integrate holes, rather than electrons. In such detectors, the voltage at 'node N' is increasing due to integration, rather than decreasing. In such pixels, typically the 'Vres' that is used to reset 'node N' is a different potential than the 'Vdd' that is connected to the drain of the source follower 'SF'. This changes the direction of the voltage step that is sensed by the correlated double sampling circuit in the readout circuitry. The skilled person will readily understand that the present invention equally relates to such embodiments.

The invention claimed is:

1. An image sensor, comprising:
a pixel array integrated on a thin-film transistor panel and comprising a plurality of active pixels arranged in a matrix of rows and columns, and comprising a plurality of column lines to which outputs of pixels in the same column are coupled for the purpose of outputting pixel signals, each of the column lines being driven between a first voltage and a second voltage lower than the first voltage;
readout circuitry comprising a plurality of readout units, each readout unit being configured for reading out a respective column line through an input node of the readout unit;
wherein the image sensor further comprises capacitive units, such as capacitors, for capacitively coupling each input node to its corresponding column line;
wherein the readout circuitry is integrated on one or more semiconductor dies of a first type, and wherein the capacitive units are integrated on one or more semiconductor dies of a second type;
wherein the one or more semiconductor dies of the first type have been manufactured using a first semiconductor process and each comprise low voltage components with which the readout circuitry is realized, the readout circuitry having a first maximum voltage rating;
wherein the one or more semiconductor dies of the second type have been manufactured using a second semiconductor process different from the first semiconductor process and each comprise high voltage components with which the capacitive units are realized, the capacitive units having a second maximum voltage rating higher than the first maximum voltage rating; and
wherein a difference between the first voltage and the second voltage is higher than the first maximum voltage rating but smaller than the second maximum voltage rating.

2. The image sensor according to claim 1, further comprising a row controller for selecting pixels among the plurality of pixels for read-out;
wherein the image sensor further comprises, for each pixel, a source follower for buffering the pixel signal and a select transistor for outputting the buffered pixel signal onto the corresponding column line in dependence of a row select signal outputted by the row controller;
wherein the image sensor further comprises, for each column line, a source follower load, such as a current source or resistor;
wherein the first voltage is the voltage that is applied to the drain of the source followers, and wherein the source follower loads are connected in between the column lines and a reference node, wherein the second voltage is the voltage that is applied to the reference node.

3. The image sensor according to claim 2, wherein the image sensor further comprises, for each pixel:
a photodiode arranged in between a signal node and a node that is kept at a first reference voltage;
a storage capacitor configured for accumulating charge due to a photocurrent generated by the photodiode; and
a reset transistor coupled in between the photodiode and a second reference voltage and being configured to set a voltage on the signal node to the second reference voltage in dependence of a reset signal outputted by the row controller.

4. The image sensor according to claim 3, wherein the first reference voltage is ground and the second voltage is a negative voltage, or the first reference voltage is a positive non-zero voltage and the second voltage is ground.

5. The image sensor according to claim 2, wherein the source follower loads are integrated on the same one or more semiconductor dies of the second type as the corresponding capacitive units.

6. The image sensor according to claim 2, wherein the row controller comprises a plurality of second segments, each second segment corresponding to a plurality of rows of the pixel array and comprising a driver for outputting, for said plurality of rows, said row select signals and said reset signals when applicable, and being integrated on a respective semiconductor die of a third type, the image sensor further comprising a plurality of second flex foils by which the thin-film transistor panel is connected to a remainder of the row controller, wherein the respective semiconductor dies of the third type are arranged on respective second flex foils.

7. The image sensor according to claim 1, wherein the readout circuitry is composed of a plurality of first segments, each first segment corresponding to a plurality of column lines and being integrated on a respective semiconductor die of the first type, the image sensor further comprising a plurality of first flex foils by which the thin-film transistor panel is connected to an external device, wherein the respective semiconductor dies of the first type are arranged on respective first flex foils;

wherein the one or more semiconductor dies of the second type on which the capacitive units are integrated that correspond to the column lines that are associated with a given first segment among the plurality of first segments are arranged on the same first flex foil as the semiconductor die of the first type that corresponds to said given first segment.

8. The image sensor according to claim 1, wherein the first maximum voltage rating is between 3 and 6 Volt, the second maximum voltage rating is between 10 and 100 Volt, and a difference between the first and second voltage is between 7.5 and 15 Volt.

9. The image sensor according to claim 1, wherein the thin-film transistor panel is based on amorphous silicon, low-temperature polycrystalline silicon, or indium gallium zinc oxide.

10. The image sensor according to claim 1, wherein the image sensor is configured to perform, for each selected pixel, a correlated double sampling measurement scheme based on first and second pixel readouts;
wherein the first pixel readout preferably corresponds to a pixel being read out a predetermined amount of time after the pixel was reset, and wherein the second pixel readout preferably corresponds to a pixel being read out directly after having been reset.

11. The image sensor of claim 10, wherein the readout circuitry is configured to read out the column lines based on a charge mode readout, wherein each readout unit is configured to set a voltage on the input node equal to a third reference voltage during the first pixel readout and second pixel readout, and wherein each readout unit is configured to determine, for each pixel, an output voltage based on a charge transfer during the second pixel readout to or from the capacitive unit.

12. The image sensor of claim 11, wherein each readout unit comprises a charge amplifier comprising an operational amplifier, having an non-inverting input connected to the third reference voltage, and an inverting input connected to the capacitive unit via a first switch, wherein an output of the operational amplifier is coupled to the inverting input via a feedback capacitor, the readout unit further comprising a second switch arranged between the output and the inverting input of the operation amplifier.

13. The image sensor of claim 11, wherein:
the readout circuitry comprises a plurality of analog-to-digital converters coupled to the outputs of the operational amplifiers of the readout units; and
the image sensor comprises a second controller configured for controlling the first and second switches such that the voltage at the input node is set to the third reference voltage by closing the first and second switches during the first pixel readout, and such that the second switch is open when performing the second pixel readout, and configured for controlling the first switch to be open when an output of the operational amplifier is converted by an analog-to-digital converter among the plurality of analog-to-digital converters.

14. The image sensor of claim 10, wherein the readout circuitry is configured to read out the column lines based on a voltage mode readout, wherein each readout unit is configured to set a voltage on the input node equal to a fourth reference voltage during the first readout and to determine an output voltage based on an change in voltage of the input node with respect to the fourth reference voltage during the second pixel readout.

15. The image sensor of claim 14, each readout unit further comprising a voltage setting unit for setting a voltage on the input node to the fourth reference voltage during the first pixel readout, and for providing a high impedance state during the second pixel readout to allow the voltage on the input node to track the pixel voltage when changing from a value corresponding to the first pixel readout to a value corresponding to the second pixel readout.

16. The image sensor of claim 15, wherein the readout circuitry comprises a plurality of analog-to-digital converters, and wherein each readout unit further comprises:
a first operational amplifier having a non-inverting input connected via a third switch to the fourth reference voltage and an inverting input connected to an output of the first operational amplifier;
a charge amplifier comprising a second operational amplifier having a non-inverting input connected to a fifth reference voltage and an inverting input that is connected via a series capacitor and series fourth switch to the output of the first operational amplifier, and connected via a parallel connection of a feedback capacitor and fifth switch to an output of the second operational amplifier, wherein the output of the second operational amplifier is connected to an analog-to-digital converter among the plurality of analog-to-digital converters; and
a third controller configured to:
control the third switch to be closed during the first pixel readout and to be open during the second pixel readout;
control the fourth switch to be closed during the first and second pixel readouts and to be open after the second pixel readout to allow an output of the second operational amplifier to be converted by the connected analog-to-digital converter; and
control the fifth switch to be open during the first pixel readout and to be closed during the second pixel readout.

17. An imaging system comprising:
the image sensor according to claim 1;
a processing unit for constructing an image based on outputs from the readout circuitry;
wherein the imaging system is configured for constructing X-ray images of an object.

18. The imaging system of claim 17, further comprising an X-ray source positioned such that the object to be imaged can be arranged between the X-ray source and image sensor.

19. The image sensor according to claim 1, wherein the first maximum voltage rating is between 3.5 and 5.7 Volt, the second maximum voltage rating is between 10 and 50 Volt, and a difference between the first and second voltage is between 8 and 12 Volt.

20. The image sensor according to claim 1, wherein the image sensor further comprises a scintillator layer arranged above the pixel array.

21. The image sensor according to claim 1, wherein the one or more semiconductor dies of one or more of the first type and the second type are based on complementary metal-oxide-semiconductor technology.

* * * * *

UNITED STATES PATENT AND TRADEMARK OFFICE
CERTIFICATE OF CORRECTION

Page 1 of 1

PATENT NO. : 11,271,029 B2
APPLICATION NO. : 17/164911
DATED : March 8, 2022
INVENTOR(S) : Smit et al.

It is certified that error appears in the above-identified patent and that said Letters Patent is hereby corrected as shown below:

On the Title Page

Left Column, item (73), Assignee: delete "Tetedyne DALSA B.V." and insert -- Teledyne DALSA B.V. --.

Signed and Sealed this
Twelfth Day of April, 2022

Drew Hirshfeld
*Performing the Functions and Duties of the
Under Secretary of Commerce for Intellectual Property and
Director of the United States Patent and Trademark Office*